United States Patent [19]

Tsuji

[11] Patent Number: 5,162,439

[45] Date of Patent: * Nov. 10, 1992

[54] ADHESIVE FOR PRINTED CIRCUIT BOARDS BASED ON EPOXY RESINS, HYDROGENATED POLYMER RUBBERS AND CURING AGENTS

[75] Inventor: Suguru Tsuji, Tokyo, Japan

[73] Assignee: Nippon Zeon Co., Ltd., Tokyo, Japan

[*] Notice: The portion of the term of this patent subsequent to Nov. 10, 2009 has been disclaimed.

[21] Appl. No.: 437,931

[22] Filed: Nov. 17, 1989

[51] Int. Cl.$^5$ ............................ C09J 3/16; C09J 3/12; B32B 15/08

[52] U.S. Cl. ........................................ 525/113; 528/91; 528/103; 528/110; 528/112; 528/113; 528/120; 528/121; 528/123; 528/124; 528/393; 525/117; 525/118; 525/119; 525/120; 525/121; 525/122; 525/502; 523/400; 428/901

[58] Field of Search ............... 525/117, 118, 119, 120, 525/121, 122, 502, 113; 528/103, 110, 112, 113, 106, 393, 91, 120, 121, 123-124

[56] References Cited

U.S. PATENT DOCUMENTS

| | | | |
|---|---|---|---|
| 4,113,914 | 9/1978 | Doss | 428/355 |
| 4,593,070 | 1/1986 | Oyama et al. | 525/119 |
| 4,632,960 | 12/1986 | Sato et al. | 525/117 |
| 4,786,675 | 11/1988 | Iwata et al. | 525/119 |

FOREIGN PATENT DOCUMENTS 62-246977 4/1986 Japan.

Primary Examiner—John C. Bleutge
Assistant Examiner—Frederick Krass
Attorney, Agent, or Firm—Wenderoth, Lind & Ponack

[57] ABSTRACT

In an adhesive for printed circuit boards, whose main components are an epoxy resin and a polymer rubber, the improvement wherein the polymer rubber is a hydrogenated conjugated diene polymer rubber having not more than 100 ppm of metal content, not more than 100 ppm of ion content as determined by ion chromatography, and an iodine value of not more than 120.

11 Claims, No Drawings

ADHESIVE FOR PRINTED CIRCUIT BOARDS BASED ON EPOXY RESINS, HYDROGENATED POLYMER RUBBERS AND CURING AGENTS

The present invention relates to an adhesive for printed circuit boards, more particularly, to an adhesive which is improved in electric insulation property, thermal resistance and peeling resistance.

A printed circuit board forms an electric circuit by means of a conductive metal board such as copper leaf combined on a hard board or a flexible board of synthetic resins having excellent electric insulation property. For hard boards, phenol-type resins, epoxy-type resins, glass fibers and papers, etc. are mainly used. For flexible boards polyimide films and polyester films, etc. are mainly used. Also, as new materials, metal boards treated with polyimide films or epoxy resins and enamel iron boards are used. For adhesion between these electric insulation boards and conductive metal boards, an epoxy resin type adhesive is mainly used, and also an adhesive consisting of epoxy resins and acrylonitrile-butadiene copolymerized rubbers (to be referred to as NBR) is used (Japanese Patent Examined Publication No. 2063/1975).

Recently, owing to an improvement in semiconductor technology, there has been an improvement in miniaturization, multifunctionalization and lowering the cost of electronic equipment. Because of this, there is a requirement for higher densities in terms of the number of devices to be loaded on printed circuit boards. Therefore, there is an emphasis on making circuit patterns finer and with greater precision, making the insulation layer thinner and making a conductive face having more layers. Under these circumstances, the adhesive layer in printed circuit boards requires improvement in thermal resistance, including thermal resistance to solder, peeling resistance and electric insulation property.

The present inventor found that an improvement in electric insulation could be realized by using a conjugated diene-type polymer rubber having not more than 100 ppm of metal content and not more than 100 ppm, determined by ion chromatography, of ion content as one component of adhesives (Japanese Patent Laid-Open Application No. 246977/1987). However, thermal resistance and peeling resistance (the resistance against peeling of conductive metal boards from electric insulation boards) of this adhesive was insufficient for printed circuit boards.

Therefore, an object of the present invention is to provide an adhesive for printed circuit boards which avoids the aforesaid defects without decreasing the electric insulation.

The present inventor found that the object of the present invention is achieved by using a hydrogenated conjugated diene-type polymer rubber having not more than 100 ppm of metal content, not more than 100 ppm of ion content, determined by ion chromatography, and an iodine value of not more than 120 in adhesives, for printed circuit boards, wherein the main components of the adhesive are an epoxy resin and this polymer rubber.

Thus, the present invention provides an adhesive whose main components are an epoxy resin and the aforesaid hydrogenated conjugated diene-type polymer rubber.

The hydrogenated conjugated diene-type polymer rubber used in the present invention must have not more than 100 ppm of metal content and not more than 100 ppm of ion content determined by ion chromatography. If the metal content exceeds 100 ppm, the electric insulation property is insufficient. Preferably, it is not more than 80 ppm. Also, if the ion content exceeds 100 ppm, the electric insulation property declines after the absorption of moisture. Preferably it is not more than 80 ppm.

This hydrogenated conjugated diene-type polymer rubber also must have an iodine value of not more than 120, to achieve thermal resistance and peeling resistance. In particular, an iodine value of not more than 80 is preferred.

Examples of hydrogenated conjugated diene-type polymer rubber used in the present invention include hydrogenated products of polymers of at least one conjugated diene-type monomer such as 1,3-butadiene, 2,3-dimethylbutadiene, isoprene and 1,3-pentadiene, etc., and hydrogenated products of copolymers of at least one conjugated diene monomer and at least one other monomer copolymerizable therewith, etc. Examples of the copolymerizable monomer include unsaturated nitriles such as acrylonitrile and methacrylonitrile, etc.; aromatic vinyl compounds such as styrene and α-methylstyrene, etc.; unsaturated carboxylic acids such as acrylic acid, methacrylic acid, itaconic acid and maleic acid, etc., and salts thereof; esters of the above-mentioned unsaturated carboxylic acids such as methyl acrylate, 2-ethylhexyl acrylate, methyl methacrylate, trifluoroethyl acrylate and trifluoroethyl methacrylate, etc.; alkoxyalkylesters of the above-mentioned unsaturated carboxylic acids such as methoxyethyl acrylate, ethoxyethyl acrylate and methoxyethoxyethyl acrylate, etc.; amide-type monomers such as acrylamide, methacrylamide, N-methylol(meth)acrylamide, N,N'-dimethylol(meth)acrylamide and N-ethoxymethyl(meth)acrylamide, etc.; cyano-substituted alkyl esters of acrylic acid such as cyanomethyl(meth)acrylate, 2-cyanoethyl(meth)acrylate and 2-ethyl-6-cyanohexyl(meth)acrylate, etc.; and epoxy group-containing monomers such as allyl glycidyl ether, glycidyl acrylate and glycidyl methacrylate, etc.

The hydrogenated conjugated diene-type polyme rubber can be a liquid polymer (having or not having functional groups, such as carboxy, hydroxy and epoxy, at the end of the molecular chain), or a solid polymer, i.e. with sufficiently high molecular weight to render the polymer solid. The hydrogenated polymer rubber has an iodine value of not more than 120, which is achieved by hydrogenating the conjugated diene monomer units of the conjugated diene-type polymer rubber.

Examples of the conjugated diene-type polymer rubber to be hydrogenated include a polybutadiene rubber, a polyisoprene rubber, a styrene-butadiene copolymer rubber (random or block copolymer), a styrene-isoprene copolymer rubber (random or block copolymer), a butadiene-acrylonitrile copolymer rubber, an isoprene-butadiene-acrylonitrile copolymer rubber, an isopreneacrylonitrile copolymer rubber, a butadiene-methylacrylate-acrylonitrile copolymer rubber, a butadieneacrylic acid-acrylonitrile copolymer rubber, a butadiene-ethylene-acrylonitrile copolymer rubber, a butyl acrylate-ethoxyethyl acrylate-vinylchloro acetate-acrylonitrile copolymer rubber, a butyl acrylate-ethoxyethyl acrylate-vinylnorbornene-acrylonitrile copolymer rubber, a butyl acrylate-ethyl acrylate-glycidylether copolymer rubber, an ethyl acrylate-butyl acrylate-acrylic acid copolymer rubber, an ethylene-methyl acrylate copolymer rubber, an ethylene-methyl acrylate-monomethyl maleate copolymer rubber, and an ethylene-methyl acrylate-vinyl acetate copolymer rubber, etc. Preferred hydrogenated conjugated diene-type polymer rubbers are hydrogenated products obtained by hydro-genating the conjugated diene monomer units of unsaturated nitrile-conjugated diene-type polymer rubbers.

In the present invention, there is no restriction on the method for preparation of hydrogenated conjugated diene-type polymer rubbers, and any kind of method may be used which can produce hydrogenated conjugated diene-type polymer rubbers to satisfy the above-mentioned requirements. As examples of such methods, there may be used a method of hydrogenation after preparing the polymer having a metal content and ion content in the above-prescribed ranges by purifying the rubber obtained in emulsion polymerization; a method of such purification after hydrogenation of rubbers obtained in emulsion polymerization; a method of hydrogenation after emulsion polymerization using emulsion agents as little as possible; a method of hydrogenation after bulk polymerization without using emulsion agents and solvents; and a method of hydrogenation after solution polymerization. Also, the hydrogenation reaction is not particularly restricted and may be carried out by ordinary means.

The essential components of the adhesive of the present invention are the above hydrogenated conjugated diene-type polymer rubbers and epoxy resins a the main components, and a curing agent. If necessary, inorganic compounding agents and solvents, etc. may be included in the adhesive.

The ratio by weight of the hydrogenated conjugated diene-type polymer rubbers to the epoxy resins in the adhesive is usually 90-10 weight % to 10-90 weight %.

The epoxy resins, curing agents and other compounding agents conventionally used for printed circuit boards are used in the adhesive of the present invention, and there is no restriction on these components in the present invention. Examples of these components are described in Japanese Patent Laid-Open Publication No. 30837/1977 and Japanese Patent Laid-Open Publication No. 81368/1984, etc. For example, there are exemplified bisphenol-type epoxy resin, glycidylester-type epoxy resin, cresol novolak-type epoxy resin and urethane-modified epoxy resin as the epoxy resins, and aliphatic polyamines, polyamide amines, aromatic polyamines and $BF_3$ complex as the curing agents. Also, there is no restriction on the mean of producing the adhesives in the present invention, which can be prepared in accordance with ordinary means.

There is no restriction on the method of using the adhesive of the present invention for production of printed circuit boards. For example, printed circuit boards are produced by coating the adhesive of the present invention on a conductive metal board, placing it on an insulating synthetic resin board or its prepreg, and then adhering each to the other under pressure, or carrying out laminate molding in accordance with an ordinary method.

The adhesive of the present invention, compared with conventional adhesives, has improved thermal resistance and peeling resistance, maintaining the same property of insulation and the same ratio of decline in insulation property after the absorption of moisture as conventional adhesives. Therefore, the use of the adhesive of the present invention brings about advantages; for example, it can increase the capacity for electronic equipment. For this reason, the present invention is greatly useful in industry.

The following Examples specifically illustrate the present invention, but the invention is not limited thereto. All parts in the Examples, except as otherwise indicated, are by weight.

EXMAPLES 1-7

Seven kinds of polymer rubbers were used (every rubber has 37 weight % of acrylonitrile monomer units), consisting of four kinds of hydrogenated acrylonitrile-butadiene copolymer rubbers (to be referred to as H—NBR), each having different iodine values, each, obtained by hydrogenation after polymerization by bulk polymerization [Examples 1-4]; H—NBR obtained by hydrogenation after polymerization by solution polymerization Example 5; H—NBR obtained by hydrogenation after purification wherein the dissolution-precipitation of the polymer rubber prepared by emulsion polymerization is carried out three times Example 6]; and H—NBR which is purified from commercial H—NBR (Zetpol 2020, made by Nippon Zeon Co., Ltd.) in the same way as in Example 6 [Example 7). The polymer rubbers are respectively dissolved in a mixed solvent consisting of dioxane, methylethylketone and dichloroethane and a 10% solution thereof was prepared. To 66 parts of this solution were added 2.8 parts of ECN1280 (made by Chiba Kagaku Co., Ltd.) as an epoxy compound and 0.78 part of diaminodiphenylsulfone as curing agent, and then the mixture was mixed with stirring at the room temperature until the mixture was sufficiently homogeneous. This mixture was coated on a polyimide film having a thickness of 50 $\mu$ so that the thickness of the coating would be 20-80 $\mu$. The solvent was removed by drying the film for 12 minutes at a temperature of 120° C. and the curing reaction was allowed to proceed A copper leaf having a thickness of 35$\mu$ was adhered onto the film under a pressure of 40 kg/cm$^2$ by heating for 15 minutes at a temperature of 170° C. The obtained copper-plated laminate board was tested for electric resistance, peeling resistance and thermal resistance to soldering. The measured data are shown in Table 1, with data for the properties of seven kinds of polymer rubbers.

As for metal contents, each metal among Li, Na, K, Mg, Ca, Al, Sn, Cu, Zn and Fe was determined by atomic absorption spectrum apparatus (Form No. 280-50 made by Hitachi Co., Ltd.), and the total content of all metals is shown as metal content in Table 1.

Ion content was determined by ion chromatography (Form No. 2000i made by Daionex Co., Ltd.; as columns HPIC-AS 1-5 and HPIC-CS 1-2 were used), and the total ion content is shown in Table 1.

Electric resistance, peeling resistance and thermal resistance to soldering were determined in accordance with JIS C6481.

COMPARATIVE EXAMPLES 1-6

Instead of the polymer rubbers in Examples 1-7, commercial H—NBR (Zetpol 2020) Comparative Example 1); two kinds of H—NBR prepared by mixing purified H—NBR (Zetpol 2020) and unpurified H—NBR (Zetpol 2020) Comparative Examples 2 and 3]; NBR, which was not hydrogenated, produced by bulk polymerization Comparative Example 4); H—NBR hydrogenated in order to have an iodine value of more than 120 after production of NBR by bulk polymerization [Comparative Example 5); and NBR, which was not hydrogenated, produced by emulsion polymerization Comparative Example 6) were prepared. Every on of these six kinds of polymer rubbers had 37 weight % of acrylonitrile monomer units. Copper-plated laminate boards were produced by using each polymer rubber in the same way as in Examples 1-7, and the electric resistance, peeling resistance and thermal resistance to soldering were determined. The measured data for these six kinds of polymer rubbers are shown in Table 2 with data for the properties thereof.

and was hydrogenated Example 8]. Also, a terpolymer rubber having the same composition as Example 8 was prepared by ordinary emulsion polymerization (to be abbreviated as X NBR-II), purified by carrying out the procedure of dissolution-precipitation three times, and then hydrogenated Example 9).

Adhesives were prepared by using these two kinds of polymer rubbers instead of the polymer rubbers of Examples 1-7, and copper-plated laminate boards were produced and evaluated, in the same way as in Examples 1-7.

TABLE 1

| | Examples | | | | | | |
|---|---|---|---|---|---|---|---|
| | 1 | 2 | 3 | 4 | 5 | 6 | 7 |
| Properties | | | | | | | |
| Polymerization method | Bulk polymerization | | | | Solution polymerization | Emulsion polymerization | |
| Hydrogenation | Yes | Yes | Yes | Yes | Yes | Yes | Yes** |
| Purification | — | — | — | — | — | Yes | Yes |
| Iodine value | 21 | 50 | 102 | 120 | 30 | 25 | 30 |
| Metal content (ppm) | 0 | 0 | 0 | 0 | 0 | 53 | 100 |
| Ion content (ppm) | 18 | 22 | 29 | 14 | 25 | 89 | 78 |
| Determined values | | | | | | | |
| Electric resistance ($\Omega$) | | | | | | | |
| Normal state | $8.1 \times 10^{10}$ | $5.8 \times 10^{10}$ | $7.1 \times 10^{10}$ | $5.8 \times 10^{10}$ | $6.5 \times 10^{10}$ | $3.2 \times 10^{10}$ | $2.1 \times 10^{10}$ |
| After hygroscopic treatment (C-96/40/90) | $7.6 \times 10^{10}$ | $5.2 \times 10^{10}$ | $6.8 \times 10^{10}$ | $5.2 \times 10^{10}$ | $6.0 \times 10^{10}$ | $2.0 \times 10^{10}$ | $9.9 \times 10^{9}$ |
| Peeling resistance (kg/cm) | 2.2 | 2.2 | 2.1 | 2.1 | 2.2 | 2.1 | 2.1 |
| Thermal resistance to soldering | | | | | | | |
| 260° C. | OK* | OK | OK | OK | OK | OK | OK |
| 280° C. | OK | OK | OK | OK | OK | OK | OK |

Notes:
*OK means no peeling
**Zetpol 2020 is used in Example 7

TABLE 2

| | Comparative Examples | | | | | |
|---|---|---|---|---|---|---|
| | 1 | 2 | 3 | 4 | 5 | 6 |
| Properties | | | | | | |
| Polymerization method | Emulsion polymerization | | | Bulk polymerization | | Emulsion polymerization |
| Hydrogenation | Yes** | Yes | Yes | No | Yes | No |
| Purification | No | Partly yes | Partly yes | Yes | Yes | No |
| Iodine value | 30 | 30 | 30 | 285 | 130 | 285 |
| Metal content (ppm) | 1250 | 165 | 78 | 0 | 0 | 1100 |
| Ion content (ppm) | 230 | 70 | 180 | 27 | 26 | 280 |
| Determined values | | | | | | |
| Electric resistance ($\Omega$) | | | | | | |
| Normal state | $5.1 \times 10^{8}$ | $7.2 \times 10^{8}$ | $6.7 \times 10^{8}$ | $7.3 \times 10^{10}$ | $7.5 \times 10^{10}$ | $4.2 \times 10^{8}$ |
| After hygroscopic treatment (C-96/40/90) | $1.2 \times 10^{8}$ | $4.4 \times 10^{8}$ | $3.9 \times 10^{8}$ | $6.7 \times 10^{10}$ | $7.2 \times 10^{10}$ | $1.0 \times 10^{8}$ |
| Peeling resistance (kg/cm) | 2.1 | 2.1 | 2.1 | 1.5 | 1.8 | 1.4 |
| Thermal resistance to soldering | | | | | | |
| 260° C. | OK* | OK | OK | OUT | OK | OUT |
| 280° C. | OK | OUT** | OUT | OUT | OUT | OUT |

Notes:
*OK means no peeling
**Zetpol 2020 is used in Example 7
***OUT means peeling observed The data in Tables 1 and 2 indicates that the adhesive of the present invention, having not more than 100 ppm each of metal content and of ion content, and an iodine value of not more than 120, has superior, excellent peeling resistance and thermal resistance to soldering, maintains sufficient electric resistance, and has well-balanced properties for use in printed circuit boards.

EXAMPLES 8 and 9

A terpolymer rubber of butadiene-acrylonitrile-methacrylic acid (62/34/4 weight %, to be abbreviated as X NBR-I) was prepared by solution polymerization ples 1-7.

COMPARATIVE EXAMPLES 7 and 8

Adhesives were prepared by using a polymer rubber obtained by hydrogenating the above-mentioned X NBR-II without purification [Comparative Example 7), and the polymer rubber X NBR-I which was not hydrogenated Comparative Example 8), in the same way as in Examples 1-7. Copper-plated boards were prepared and evaluated in the same way as in Examples 1-7.

The measured data and properties of four kinds of polymer rubbers, Examples 8 and 9 and Comparative Examples 7 and 8, are shown in Table 3.

Adhesives were prepared by using these two kinds of polymer rubbers instead of the polymer rubbers of Examples 1–7, and copper-plated laminate boards were produced and evaluated in the same way as in Examples 1–7.

TABLE 3

|  | Examples | | Comparative Examples | |
|---|---|---|---|---|
|  | 8 | 9 | 7 | 8 |
| Properties | | | | |
| Polymerization method | Solution polymerization (X NBR-I) | Emulsion polymerization (X NBR-II) | Emulsion polymerization (X NBR-II) | Solution polymerization (X NBR-I) |
| Hydrogenation | Yes | Yes | Yes | No |
| Purification | — | Yes | No | — |
| Iodine value | 35 | 35 | 35 | 290 |
| Metal content (ppm) | 0 | 72 | 1250 | 0 |
| Ion content (ppm) | 19 | 87 | 470 | 30 |
| Determined values | | | | |
| Electric resistance ($\Omega$) | | | | |
| Normal state | $7.5 \times 10^{10}$ | $4.3 \times 10^{10}$ | $4.9 \times 10^{8}$ | $6.3 \times 10^{10}$ |
| After hygroscopic treatment (C-96/40/90) | $7.0 \times 10^{10}$ | $3.4 \times 10^{10}$ | $1.4 \times 10^{8}$ | $5.8 \times 10^{10}$ |
| Peeling resistance (kg/cm) | 2.4 | 2.3 | 2.3 | 1.6 |
| Thermal resistance to soldering | | | | |
| 260° C. | OK* | OK | OK | OUT |
| 280° C. | OK | OK | OUT*** | OUT |

Notes:
*OK means no peeling
***OUT means peeling observed

The data in Table 3 indicates that the adhesive of the present invention, having not more than 100 ppm each of metal content and of ion content, and an iodine value of not more than 120, has excellent peeling resistance and thermal resistance to soldering, and has well-balanced properties with electric resistance.

EXAMPLES 10 and 11

A terpolymer rubber of butadiene-acrylonitrile-butyl acrylate (65/25/10 weight %, to be abbreviated as X NBR-III) was prepared by bulk polymerization and was hydrogenated [Example 10]. Also, a terpolymer rubber having the same composition as Example 10 was prepared by ordinary emulsion polymerization (to be abbreviated as X NBR-IV), purified by carrying out the procedure of dissolution-precipitation three times, and then hydrogenated [Example 11].

COMPARATIVE EXAMPLES 9 and 10

Adhesives were prepared by using a polymer rubber obtained by hydrogenating the above-mentioned X NBR-IV without purification [Comparative Example 9], and the polymer rubber X NBR-III which was not hydrogenated Comparative Example 10), in the same way as in Examples 1–7. Copper-plated laminated boards were prepared and evaluated in the same way as in Examples 1–7.

The measured data and properties of four kinds of polymer rubbers, Examples 10 and 11 and Comparative Examples 9 and 10, are shown in Table 4.

TABLE 4

|  | Examples | | Comparative Examples | |
|---|---|---|---|---|
|  | 10 | 11 | 9 | 10 |
| Properties | | | | |
| Polymerization method | Bulk polymerization (X NBR-III) | Emulsion polymerization (X NBR-IV) | Emulsion polymerization (X NBR-IV) | Bulk polymerization (X NBR-III) |
| Hydrogenation | Yes | Yes | Yes | No |
| Purification | — | Yes | No | — |
| Iodine value | 35 | 35 | 35 | 300 |
| Metal content (ppm) | 0 | 53 | 980 | 0 |
| Ion content (ppm) | 30 | 72 | 310 | 32 |
| Determined values | | | | |
| Electric resistance ($\Omega$) | | | | |
| Normal state | $6.3 \times 10^{10}$ | $4.0 \times 10^{10}$ | $5.5 \times 10^{8}$ | $5.8 \times 10^{10}$ |
| After hygroscopic treatment (C-96/40/90) | $6.0 \times 10^{10}$ | $3.1 \times 10^{10}$ | $2.2 \times 10^{8}$ | $5.2 \times 10^{10}$ |
| Peeling resistance (kg/cm) | 2.2 | 2.1 | 2.0 | 1.7 |
| Thermal resistance to soldering | | | | |
| 260° C. | OK* | OK | OK | OUT |
| 280° C. | OK | OK | OUT*** | OUT |

Notes:
*OK means no peeling
***OUT means peeling observed

The data in Table 4 indicates that the adhesive of the present invention, having not more than 100 ppm each of metal content and of ion content, and an iodine value of not more than 120, has excellent peeling resistance, thermal resistance to soldering, and electric resistance.

Thus, the adhesive of the present invention provides printed circuit boards having excellent peeling resistance and thermal resistance to soldering without impairing he insulation property thereof, resulting in a community of well-balanced properties.

What is claimed is:

1. In an adhesive for printed circuit boards, consisting of and epoxy resin, a polymer rubber, a curing agent and a solvent, the improvement wherein the polymer rubber is a hydrogenated conjugated diene polymer rubber having not more than 10 ppm of metal content, not more than 100 ppm of ion content as determined by ion chromatography, and an iodine value of not more than 120.

2. The adhesive of claim 1 in which the hydrogenated conjugated diene polymer rubber is a hydrogenation product of a polymer of at least one conjugated diene monomer.

3. The adhesive of claim 1 in which the hydrogenated conjugated diene polymer rubber is a hydrogenation project of a copolymer of at least one conjugated diene monomer ant at least one other monomer copolymerizable therewith.

4. The adhesive of claim 3 in which the hydrogenated conjugated diene polymer rubber is a hydrogenation project of an acrylonitrile-butadiene copolymer rubber.

5. The adhesive of claim 3 in which the hydrogenated conjugated diene polymer rubber is a hydrogenation project of a butadiene-acrylonitrile-methacrylic acid terpolymer rubber.

6. The adhesive of claim 3 in which the hydrogenated conjugated diene polymer is a hydrogenation project of a butadiene-acrylonitrile-butyl acrylate termpolymer rubber.

7. The adhesive of claim 1 in which the hydrogenated conjugated diene polymer rubber has a metal content of not more than 80 ppm.

8. The adhesive of claim 1 in which the hydrogenated conjugated diene polymer rubber has an ion content of not more than 80 ppm.

9. The adhesive of claim 1 in which the hydrogenated conjugated diene polymer rubber has an iodine value of not more than 80.

10. The adhesive of claim 1 in which the hydrogenated conjugated diene polymer rubber and the epoxy resin are present in a weight ratio of 90-10 : 10-90.

11. The adhesive of claim 1 in which the polymer rubber is a hydrogenated, nitrile group-containing conjugated diene polymer rubber.

* * * * *